(12) United States Patent
Zeng et al.

(10) Patent No.: US 12,352,794 B2
(45) Date of Patent: Jul. 8, 2025

(54) CAPACITANCE MEASUREMENT CIRCUIT

(71) Applicant: Guangzhou University, Guangzhou (CN)

(72) Inventors: Yanhan Zeng, Guangzhou (CN); Haochang Zhi, Guangzhou (CN); Yongnan Chen, Guangzhou (CN); Junkai Chen, Guangzhou (CN); Jingci Yang, Guangzhou (CN); Tianxian Wu, Guangzhou (CN)

(73) Assignee: Guangzhou University, Guangzhou (CN)

( * ) Notice: Subject to any disclaimer, the term of this patent is extended or adjusted under 35 U.S.C. 154(b) by 105 days.

(21) Appl. No.: 18/299,088

(22) Filed: Apr. 12, 2023

(65) Prior Publication Data

US 2023/0314495 A1 Oct. 5, 2023

Related U.S. Application Data

(63) Continuation of application No. PCT/CN2021/111758, filed on Aug. 10, 2021.

(30) Foreign Application Priority Data

Aug. 12, 2020 (CN) .......................... 202010806476.X (51) Int. Cl.
*G01R 27/26* (2006.01)

(52) U.S. Cl.
CPC .................. *G01R 27/2605* (2013.01)

(58) Field of Classification Search
CPC .... G06F 3/044; G06F 3/0418; G06F 3/03547; G06F 3/0488; G06F 1/3206;
(Continued)

(56) References Cited

U.S. PATENT DOCUMENTS

| 8,432,172 B2 * | 4/2013 | Tan ..................... G01R 27/2605 324/686 |
| 10,845,926 B2 * | 11/2020 | Wang ................. G01R 27/2605 |

(Continued)

*Primary Examiner* — Vinh P Nguyen
(74) *Attorney, Agent, or Firm* — Hemisphere Law, PLLC; Zhigang Ma (57) ABSTRACT

A capacitance measurement circuit includes an analog front-end (AFE) circuit with current mirror circuits, a parasitic capacitor, an AD converter, an output shift register, and a controller. The controller disconnects a capacitor to be measured and connects one current mirror circuit to record an AFE output voltage $V_N$ collected at an inverting input terminal of the AD converter, then connects the capacitor to be measured to collect an AFE output voltage $V_P$ at a non-inverting input terminal of the AD converter, and converts a value of $(V_P - V_N)$ into a first digital signal; determines, based on the value of the first digital signal, a connection number m of the current mirror circuits, controls the analog front-end circuit to connect m current mirror circuits, and repeat the steps to obtain a second digital signal; and shift the second digital signal based on the connection number m to obtain a capacitance measurement value.

7 Claims, 4 Drawing Sheets

(58) Field of Classification Search
CPC .......... G06F 2203/0339; G01R 31/382; G01R 27/2605; G01R 31/392; G01R 15/06; G01R 19/0084; G01R 19/16542; G01R 31/64; G01R 29/24; G01R 15/16; G01R 27/26

See application file for complete search history.

(56) References Cited

U.S. PATENT DOCUMENTS

| | | | |
|---|---|---|---|
| 10,921,938 B2 * | 2/2021 | Wang | G06F 3/0418 |
| 11,092,633 B2 * | 8/2021 | Shimada | G06F 3/04166 |
| 11,190,197 B2 * | 11/2021 | Rajasekhar | H03M 1/0607 |
| 11,567,603 B2 * | 1/2023 | Shimada | G06F 3/044 |

* cited by examiner

CAPACITANCE MEASUREMENT CIRCUIT

TECHNICAL FIELD

The disclosure relates to the field of integrated circuits, and more particularly to a capacitance measurement circuit.

BACKGROUND

Capacitance measurement is a conventional technology in the field of integrated circuits. With the development of science and technology, the accuracy requirements for capacitance measurement are getting higher and higher, especially in the case of small capacitance values, for example, the capacitance values are below 200 farads (abbreviated as F). In the related art, capacitance measurement mainly involves applying current or voltage to a capacitor to be measured after designing a detection circuit and calculating a capacitance value of the capacitor to be measured through comparison. However, for capacitors with weak capacitance values, the related arts are limited by the accuracy requirements of various devices in real circuits, and their margin of error is high, which in fact cannot achieve the same or similar data as in theory. If components with higher accuracy are replaced, the cost of the circuit will be greatly increased, which is not conducive to expansion and application.

SUMMARY

Embodiments of the disclosure provide a capacitance measurement circuit, which realizes the detection of a small capacitance value in a large range through two measurements, reduces the measurement error and improves the measurement accuracy.

The disclosure provides a capacitance measurement circuit, including an analog pre-stage circuit, a parasitic capacitor, an analog to digital converter (ADC), an output shift register, and a controller.

Input terminals of the ADC are connected to an output terminal of the analog front-end circuit, and an output terminal of the ADC is connected to the output shift register.

An input terminal of the analog front-end circuit is connected to the parasitic capacitor and a capacitor to be measured individually; the analog front-end circuit includes M numbers of current mirror circuits connected in parallel, where $M=2^{N-1}$ and N is a positive integer.

The controller is configured (i.e., structured and arranged) to control the analog front-end circuit, the parasitic capacitor, the ADC, and the output shift register to measure the capacitor to be measured, specifically to:

step 1, control one of the current mirror circuits of the analog front-end circuit to be turned on;

step 2, disconnect connection of the capacitor to be measured, and control an inverting input terminal of the ADC to continuously collect analog front end (AFE) output voltages of the analog front-end circuit before the connection of the capacitor to be measured;

step 3, control the analog front-end circuit to charge the parasitic capacitor to a first reference voltage, and record an AFE output voltage $V_N$ currently collected at the inverting input terminal of the ADC;

step 4, connect the capacitor to be measured, after the analog front-end circuit is stabilized, control a non-inverting input terminal of the ADC to collect an AFE output voltage $V_P$ of the analog front-end circuit, and control the ADC to convert a difference value $(V_P-V_N)$ of the AFE output voltage $V_P$ and the AFE output voltage $V_N$ into a first digital signal;

step 5, determine, based on a value of the first digital signal, a connection number m of the current mirror circuits, and control the m numbers of current mirror circuits of the analog front-end circuit to be turned on; where $m=2^{n-1}$ and n is a positive integer less than or equal to N; and step 6, repeat the step 2 to step 4 to obtain a second digital signal, and control, based on the connection number m, the output shift register to shift the second digital signal to obtain a capacitance measurement value of the capacitor to be measured.

In an embodiment, after the step 5, the first digital signal is taken as the capacitance measurement value of the capacitor to be measured when a value of the connection number m is 1.

In an embodiment, in the step 5, the determine, based on a value of the first digital signal, a connection number m of the current mirror circuits, specifically:

the connection number m is 1 when the value of the first digital signal is greater than $D_{max}/2$; where $D_{max}$ is a maximum output value of the ADC;

the connection number m is 2 when the value of the first digital signal is less than $D_{max}/2$ and greater than $D_{max}/8$;

the connection number m is $2^{i-1}$ when the value of the first digital signal is less than $D_{max}/2^i$ and greater than $D_{max}/2^{i+1}$; where i is a positive integer greater than or equal to 3.

In an embodiment, in the step S6, the control, based on the connection number m, the output shift register to shift the second digital signal to obtain a capacitance measurement value of the capacitor to be measured, specifically:

control, in response to the value of the connection number m being 1, the output shift register to not shift the second digital signal to obtain the capacitance measurement value of the capacitor to be measured;

control, in response to the value of the connection number m being 2, the output shift register to shift the second digital signal by one bit to right to obtain the capacitance measurement value of the capacitor to be measured;

control, in response to the value of the connection number m being $2^{i-1}$, the output shift register to shift the second digital signal to the right by i−1 bits to obtain the capacitance measurement value of the capacitor to be measured.

In an embodiment, the analog front-end circuit includes an operational amplifier, a first capacitor, a second capacitor, a voltage follower, and the M numbers of current mirror circuits connected in parallel.

Specifically, each of the current mirror circuits includes two current mirror sub-circuits with a width to length ratio of 1:1 and a reverser arranged between the two current mirror sub-circuits.

A non-inverting input terminal of the operational amplifier is connected to the input terminal of the analog front-end circuit, an inverting input terminal of the operational amplifier is connected to a first end of the first capacitor, and an output terminal of the operational amplifier is connected to the M numbers of current mirror circuits connected in parallel.

An input terminal of the voltage follower is individually connected to a first end of the second capacitor and the M numbers of current mirror circuits connected in parallel, and an output terminal of the voltage follower is connected to the output terminal of the analog front-end circuit.

A second end of the first capacitor and a second end of the second capacitor each are connected to a signal ground.

In an embodiment, the analog front-end circuit further includes a plurality of control switches and a plurality of MOS transistors.

The controller is configured to control the analog front-end circuit by controlling the plurality of control switches and the plurality of MOS transistors.

In an embodiment, the input terminal of the analog front-end circuit is connected to the capacitor to be measured, specifically:

the input terminal of the analog front-end circuit is connected to the capacitor to be measured through a control switch S3 of the plurality of control switches.

The controller is further configured to control the control switch S3 to switch on to thereby control the connection of the capacitor to be measured, or control the control switch S3 to switch off to thereby control the disconnection of the capacitor to be measured.

In an embodiment, the input terminals of the ADC are connected to the output terminal of the analog front-end circuit, specifically:

the inverting input terminal of the ADC is connected to the output terminal of the analog front-end circuit through a control switch S4 of the plurality of control switches, and the non-inverting input terminal of the ADC is connected to the output terminal of the analog front-end circuit.

The controller is further configured to control the control switch S4 to switch on to thereby control connection of the inverting input terminal of the ADC, or control the control switch S4 to switch off to thereby control disconnection of the inverting input terminal of the ADC.

As can be seen from the above, the capacitance measurement circuit provided by the disclosure includes the analog front-end circuit, the parasitic capacitor, the ADC, the output shift register, and the controller. The analog front-end circuit includes the M numbers of parallel current mirror circuits. The controller disconnects the capacitor to be measured and controls one current mirror circuit to be turned on, records the AFE output voltage $V_N$ collected at the inverting input terminal of the ADC through the charging of the parasitic capacitor and the output of the front-end circuit, and then connects the capacitor to be measured. After the analog front-end circuit is stabilized, the controller collects the AFE output voltage $V_P$ at the same input terminal of the ADC, and converts the difference value of $(V_P-V_N)$ into a first digital signal; determines the connection number m of the current mirror circuits according to the value of the first digital signal, controls the analog front-end circuit to connect the m numbers of current mirror circuits, and repeats the above steps to obtain a second digital signal; and finally shifts the second digital signal according to the connection number m to obtain the capacitance measurement value of the capacitor to be measured. Compared to the related art which needs to rely on the component accuracy of the measurement circuit when weak capacitance is measured, in the disclosure, the capacitance measurement value of the capacitor to be measured is obtained by determining the range of the capacitance to be measured through the first rough measurement and then performing a fine measurement after the m numbers of current mirror circuits are connected. The disclosure realizes the detection of small capacitance values in a large range through two measurements, reduces measurement errors, and improves measurement accuracy.

DETAILED DESCRIPTION OF EMBODIMENTS

In the following, the technical solutions of embodiments of the disclosure will be clearly and completely described in conjunction with the accompanying drawings. Apparently, the described embodiments are only a part of the embodiments of the disclosure, not all of them. Based on the embodiments in the disclosure, all other embodiments obtained by those skilled in the art without creative work fall within the scope of protection of the disclosure.

Figure 1:
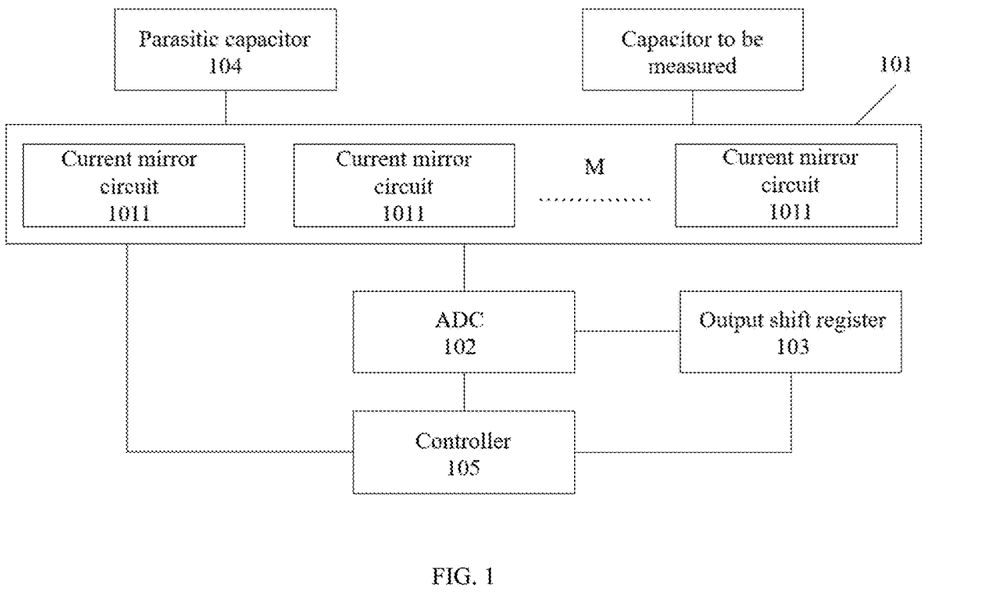
FIG. 1 is a schematic structural diagram of a capacitance measurement circuit of an embodiment of the disclosure.

FIG. 1 is a schematic structural diagram of a capacitance measurement circuit of an embodiment of the disclosure. As shown in FIG. 1, the circuit includes an analog front-end circuit 101 (AFE), an analog to digital converter 102 (ADC), an output shift register 103, a parasitic capacitor 104, and a controller 105.

Input terminals of the ADC 102 are connected to an output terminal of the analog front-end circuit 101, and an output terminal of the ADC 102 is connected to the output shift register 101. An input terminal of the analog pre-stage circuit 101 is connected to the parasitic capacitor 104 and a capacitor to be measured individually. The analog front-end circuit 101 includes M numbers of current mirror circuits 1011 connected in parallel, where $M=2^{N-1}$ and N is a positive integer.

Figure 2:
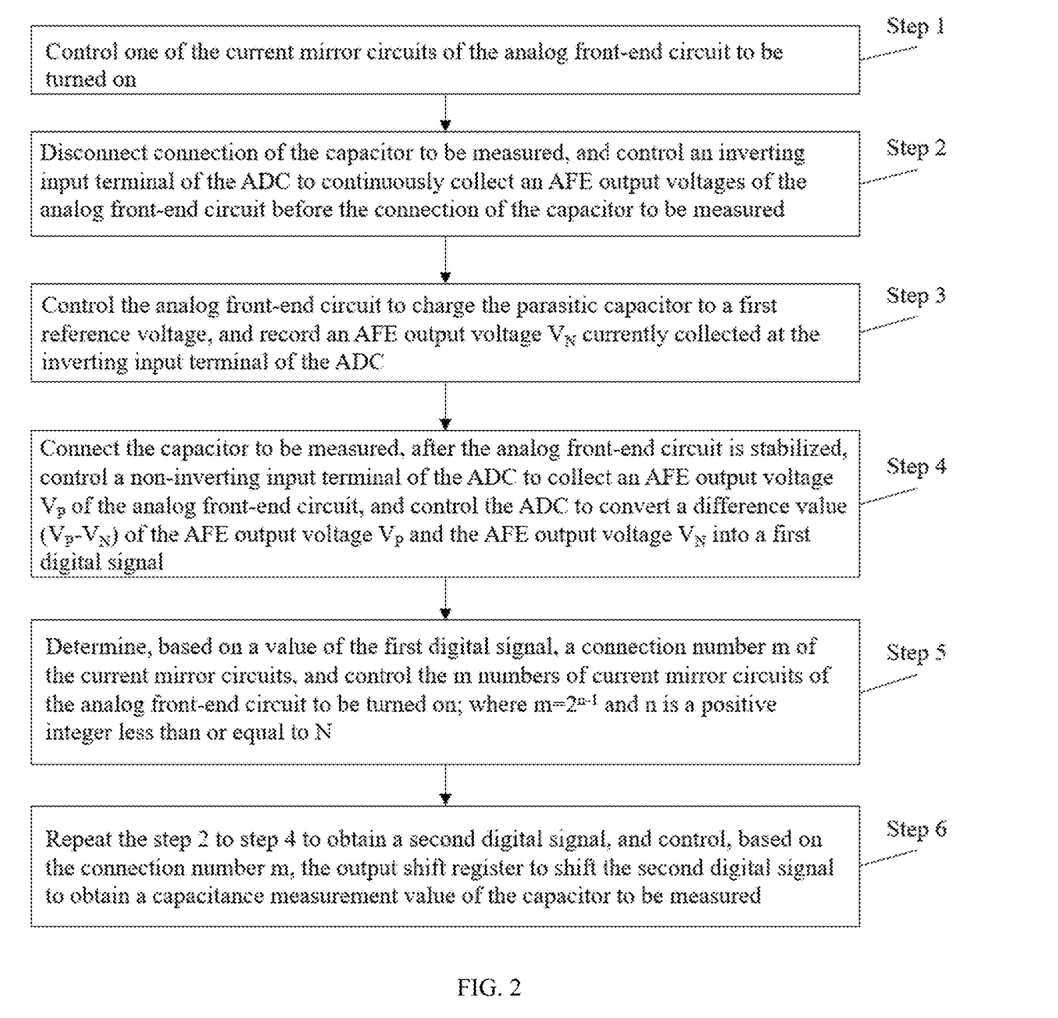
FIG. 2 is a schematic flowchart of a capacitance measurement method of an embodiment of the disclosure.

The controller 105 is configured to control the analog pre-stage circuit 101, the parasitic capacitor 104, the ADC 102, and the output shift register 103 to measure the capacitor to be measured. FIG. 2 is a schematic flowchart of a capacitance measurement method of an embodiment of the disclosure. As shown in FIG. 2, the process includes step 1 to step 6, the steps are as follows.

At the step 1, control one of the current mirror circuits of the analog front-end circuit to be turned on.

At the step 2, disconnect the capacitor to be measured, and control an inverting input terminal of the ADC to continuously collect an analog front end (AFE) output voltages of the analog front-end circuit before the connection of the capacitor to be measured.

At the step 3, control the analog front-end circuit to charge the parasitic capacitor to a first reference voltage, and record an AFE output voltage $V_N$ currently collected at the inverting input terminal of the ADC.

At the step 4, connect the capacitor to be measured, after the analog front-end circuit is stabilized, control a non-inverting input terminal of the ADC to collect an AFE output voltage $V_P$ of the analog front-end circuit, and control the ADC to convert a difference value $(V_P-V_N)$ of the AFE output voltage $V_P$ and the AFE output voltage $V_N$ into a first digital signal.

At the step 5, determine, based on a value of the first digital signal, a connection number m of the current mirror circuits, and control the m numbers of current mirror circuits of the analog front-end circuit to be turned on, where $m=2^{n-1}$ and n is a positive integer less than or equal to N.

At the step 6, repeat the step 2 to step 4 to obtain a second digital signal, and control, based on the connection number m, the output shift register to shift the second digital signal to obtain a capacitance measurement value of the capacitor to be measured.

In the embodiment, in the step 2 to step 4, the controller controls only one current mirror circuit of the analog front-end circuit to be turned on, and the ADC collects the AFE output voltage before and after the capacitor to be measured is connected individually, so as to complete the first rough measurement of the capacitance. In the step 5, the range where the capacitor to be measured is located is determined based on the results of the rough measurement, thereby determining the connection number m of the current mirror circuits. In the step 6, after the m numbers of current mirror circuits are switched on, the capacitor to be measured is finely measured, and the finely measured result is shifted to obtain a final capacitance measurement value.

In an illustrated embodiment, if the determined connection number m=1 during the first rough measurement, in order to save repeated measurements, the first digital signal can be used as the capacitance measurement value of the capacitor to be measured, improving measurement efficiency.

In the embodiment, in the step 5, the determine, based on a value of the first digital signal, a connection number m of the current mirror circuits, specifically includes:
the connection number m is 1 when the value of the first digital signal is greater than $D_{max}/2$; where $D_{max}$ is a maximum output value of the ADC;
the connection number m is 2 when the value of the first digital signal is less than $D_{max}/2$ and greater than $D_{max}/8$;
the connection number m is $2^{i-1}$ when the value of the first digital signal is less than $D_{max}/2^i$ and greater than $D_{max}/2^{i+1}$; where i is a positive integer greater than or equal to 3.

In the embodiment, the maximum output value $D_{max}$ of the ADC is used as a judgment parameter to determine the connection number m required by the capacitor to be measured. Since the connection number of the current mirror circuit M is $2^{N-1}$, when the connection number m is 1, the corresponding range for the first digital signal is ($D_{max}/2$, $D_{max}$); when the connection number m is 2, the corresponding range of the first digital signal is ($D_{max}/8$, $D_{max}/2$); when the connection number m is 4, the corresponding range of the first digital signal is ($D_{max}/16$, $D_{max}/8$); and when the connection number m is i, the corresponding range of the first digital signal is ($D_{max}/2^{i+1}$, $D_{max}/2^i$), where i is a positive integer greater than or equal to 3.

In this embodiment, in the step 6, the control, based on the connection number m, the output shift register to shift the second digital signal to obtain a capacitance measurement value of the capacitor to be measured, specifically, specifically includes:
control, in response to the value of the connection number m being 1, the output shift register to not shift the second digital signal to obtain the capacitance measurement value of the capacitor to be measured;
control, in response to the value of the connection number m being 2, the output shift register to shift the second digital signal by 1 bit to right to obtain the capacitance measurement value of the capacitor to be measured;
control, in response to the value of the connection number m being $2^{i-1}$, the output shift register to shift the second digital signal to the right by i−1 bits to obtain the capacitance measurement value of the capacitor to be measured.

In the embodiment, if two current mirror circuits are connected, the digital signal is shifted by one bit to the right; if four current mirror circuits are connected, the digital signal is shifted two bits to the right; and if eight current mirror circuits are connected, the digital signal is shifted three bits to the right.

Figure 3:
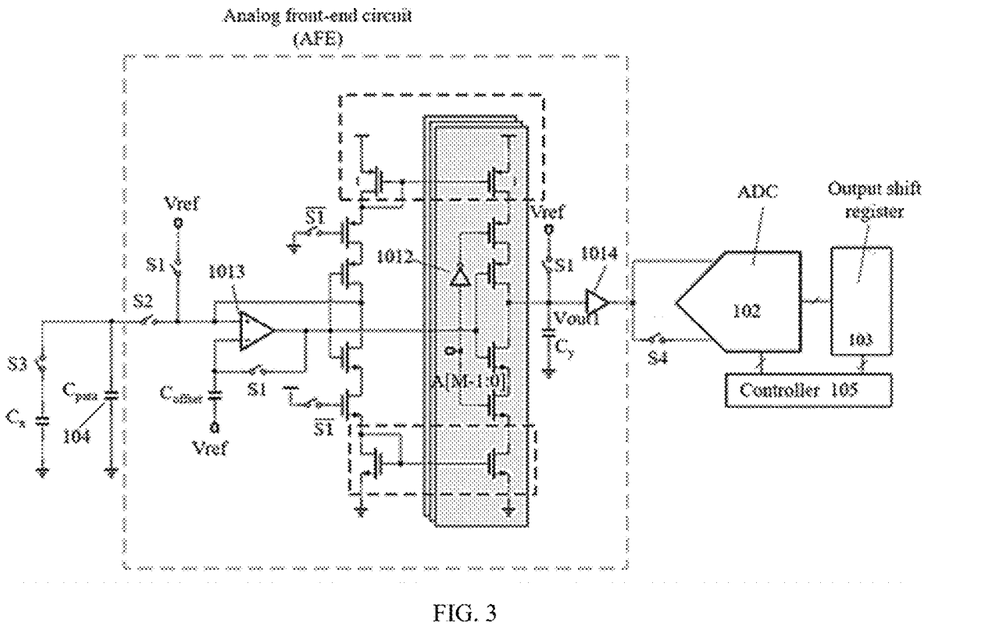
FIG. 3 is a schematic structural diagram of the capacitance measurement circuit of another embodiment of the disclosure.

To better illustrate the circuit structure and working principle of the disclosure, FIG. 3 is a schematic structural diagram of the capacitance measurement circuit of another embodiment of the disclosure. As shown in FIG. 3, the analog front-end circuit includes an operational amplifier 1013, a first capacitor $C_{offset}$, a second capacitor $C_y$, a voltage follower 1014, and M numbers of current mirror circuits 1011 connected in parallel. Specifically, one current mirror circuit includes two current mirror sub-circuits with a width to length ratio of 1:1, and a reverser 1012 arranged between the two current mirror sub-circuits.

A non-inverting input terminal of the operational amplifier 1013 is connected to the input terminal of the analog front-end circuit, an inverting input terminal of the operational amplifier 1013 is connected to a first end of the first capacitor $C_{offset}$, and an output terminal of the operational amplifier 1013 is connected to the M numbers of current mirror circuits 1011 connected in parallel. An input terminal of the voltage follower 1014 is individually connected to a first end of the second capacitor $C_y$ and the M numbers of current mirror circuits 1011 connected in parallel, and an output terminal of the voltage follower 1014 is connected to the output terminal of the analog front-end circuit. A second end of the first capacitor $C_{offset}$ and a second end of the second capacitor $C_y$ each are connected to a signal ground.

In the embodiment corresponding to FIG. 3, the analog front-end circuit further includes several control switches and several metal-oxide-silicon (MOS) transistors. The controller 105 controls the several control switches (S1, S2) and the MOS transistors to thereby control the analog front-end circuit.

The input terminal of the analog front-end circuit is connected to the capacitor to be measured $C_x$, specifically, the input terminal of the analog front-end circuit is connected to the capacitor to be measured $C_x$ through a control switch S3. The controller 105 is further configured to control the control switch S3 to switch on to thereby control the connection of the capacitor to be measured, or control the control switch S3 to switch off to thereby control the disconnection of the capacitor to be measured.

The input terminal of the ADC 102 is connected to the output terminal of the analog front-end circuit 101, specifically, the inverting input terminal of the ADC 102 is connected to the output terminal of the analog front-end circuit 101 through a control switch S4, and the non-inverting input terminal of the ADC 102 is connected to the output terminal of the analog front-end circuit 101. The controller 105 is further configured to control the control switch S4 to switch on to thereby control connection of the inverting input terminal of the ADC, or control the control switch S4 to switch off to thereby control disconnection of the inverting input terminal of the ADC.

As shown in FIG. 3, the analog front-end circuit 101 is configured to linearly and correspondingly convert the capacitance value of the input capacitor to be measured into a voltage value that can be measured by the ADC 102. The internal operational amplifier 1013 is a first-stage operational amplifier with low offset voltage. The capacitor $C_{offset}$ is a picofarad capacitor configured to store the output offset voltage of the operational amplifier during the correction process. Vref is a first reference voltage introduced externally, and the capacitor $C_y$ is a capacitor configured to collect charges. The voltage follower 1014 uses a one-stage or two-stage structure to isolate the ADC 102 and the analog front-end circuit 101 and to provide impedance matching.

The current mirror circuit at a center of the analog front-end circuit 101 includes two current mirror sub-circuits with a width to length ratio of 1:1. The width to length ratio of the current mirror sub-circuit is the width to length ratio of the conducting channel of the MOS transistor, which determines the times of the current flowing into and out of the source and drain of the MOS transistor under the same four port voltages. Assuming that in a certain circuit, the current flowing into the source and drain of a PMOS transistor (also referred to as positive MOS transistor) at M=1 is x, then if M is increased to 2, the current will correspondingly become 2x. The current mirror circuit is configured to copy the charge flowing through the capacitor $C_x$ at the left end to the capacitor $C_y$ at the right end, and M numbers of circuits with the same structure are connected in parallel at the right end of the current mirror circuit, M=(1, 2, 4, 8, ... $2^{N-1}$). The parallel circuits are different in that the inputs of the reversers are A[0] to A[M−1]. A[M−1:0] is generated by the controller 105 to control the charge gain multiple flowing into the capacitor $C_y$ and is an M bit digital signal.

The entire circuit uses eight switches, of which S3 controls any form of off-chip switching, and the remaining seven switches are on-chip MOS switches. The functions of each switch are briefly described as follows.

The control switch S1 is configured to control initialization of the analog front-end circuit.

The control switch S2 is configured to communicate a control signal of on-chip and off-chip circuits.

The control switch S3 is configured to control whether the on-chip capacitor to be measured $C_x$ is connected.

The control switch S4 is configured to switch a signal of the input terminal of the ADC.

In the embodiment, the ADC 102 has a differential input and a parallel output and is configured to convert the voltage value output by the analog front-end circuit 101 into a digital quantity. The controller 105 is configured to generate a control timing logic of the control switches S1 to S4 to thereby control the switches in the analog front-end circuit 101 to be turned on, provide a clock signal and a sampling control signal for the ADC 102, provide a shift control signal for the output shift register 103, and control the signal of A[M−1:0] based on the first digital signal output by the ADC 102. The output shift register 103 is a shift register with the same output bit width as the ADC 102, which is configured to perform a shift operation on the output digital quantity of the ADC 102. The parasitic capacitor $C_{para}$ is a capacitor of the pad inside and outside the chip. After the chip is packaged, it needs to lead out the pins to the outside, iso that it can be used. Pad is the metal that connects the inside and outside of the chip, and the layer of metal has parasitic capacitance with both the inside and outside.

Figure 4:
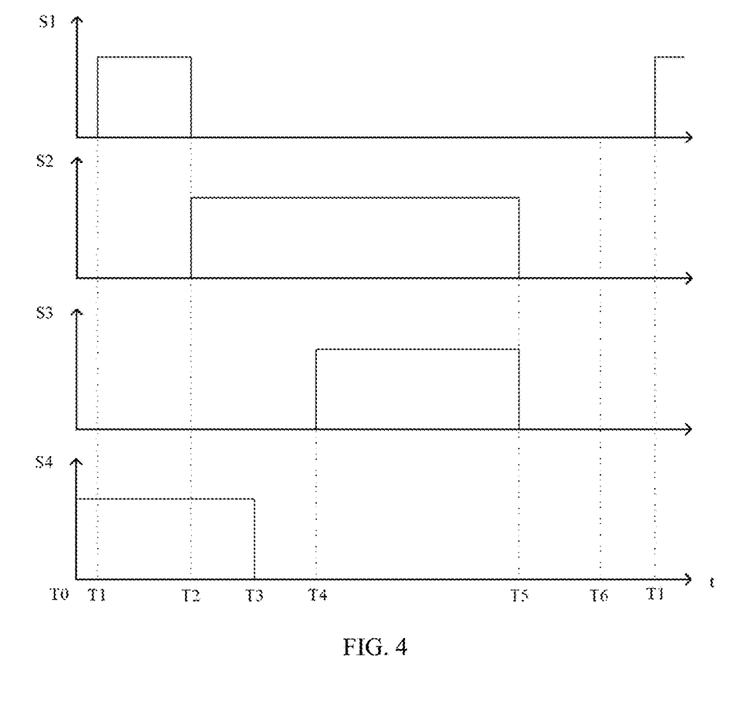
FIG. 4 is a circuit switching timing diagram of an embodiment of the disclosure.

In order to illustrate the working principle of the disclosure better, referring to the circuit switching timing diagram in FIG. 4, the actions performed by the circuits at various time points are given below with reference to the timing diagram and FIG. 3.

T0: A is set to $(0001)_2$ to start capacitance measurement.

T1: the switches S1 and S4 are turned on, the circuit is initialized, the feedback loop at the non-inverting terminal of the operational amplifier 1013 is disconnected, the feedback loop at the inverting input terminal is connected, the offset voltage $V_{offset}$ of the operational amplifier is saved to the $C_{offset}$, $C_y$ is initially set to Vref, and the inverting input terminal of the ADC 102 continuously collects the AFE output voltage before the capacitor to be measured $C_x$ is connected.

T2: the switch S1 is turned off, the switches S2 and S4 are turned on, the measurement pins of the chip are turned on, and the switches used for initialization are turned off. At this time, the inverted input voltage of the operational amplifier 1013 is $V_{offset}$, offsetting the offset voltage of the operational amplifier 1013. In this situation, the equivalent parasitic capacitor 104 parasitic on the pad and the external connection is charged to Vref.

T3: the switch S4 is turned off, the switch S2 is turned on, and the inverting input terminal of the ADC 102 is disconnected. At this time, the AFE output voltage before the capacitor to be measured $C_x$ is connected has been stored to the inverting input terminal of the ADC 102, which is recorded as $V_N$.

T4: the switches S2 and S3 are turned on, the capacitor to be measured $C_x$ is connected, and the non-inverting input terminal of the operational amplifier 1013 is pulled down to control the push-pull stage to supplement the charge. In this situation, the current mirror circuit 1011 injects M times of charge into $C_y$. After the circuit is stabilized, the upper anode voltage $V_P$ of $C_y$ is stored to the non-inverting input terminal of the ADC 102, and the ADC 102 starts to convert the value of $V_P - V_N$.

T5: after the first acquisition is completed, all switches are turned off, and the output value of the ADC 102 is D1. Assuming that the maximum output value of the ADC 102 is $D_{max}$, if D1 is greater than $D_{max}/2$, then A remains unchanged; if D1 is less than $D_{max}/2$ and greater than $D_{max}/8$, A is set to $(0011)_2$; if D1 is less than $D_{max}/8$, A is set to $(1111)_2$, and so on.

T6: T1 to T4 are performed again according to the obtained connection number of current mirror circuits controlled by the obtained A to obtain the second output D2 of the ADC 102, D2 is input into the output shift register and shifted one bit to the right based on the connection number, the right shift operation is repeated for an integer number not greater than M/2 to obtain the actual measurement value.

Figure 5:
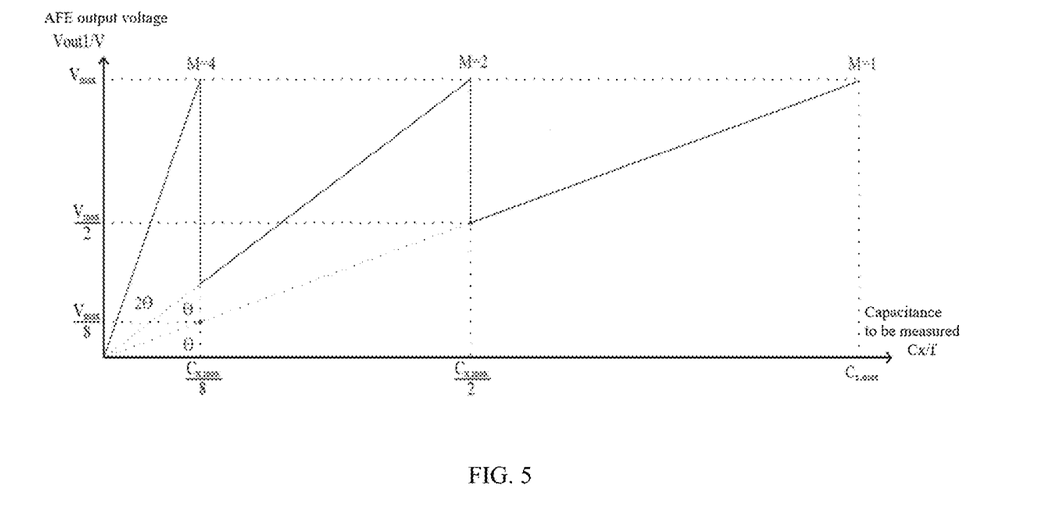
FIG. 5 is a diagram showing a capacitance-voltage conversion relationship of the embodiment of the disclosure.

FIG. 5 is a diagram showing a capacitance-voltage conversion relationship of the circuit. Through two measurements, the input capacitance to be measured is converted into a voltage value linearly corresponding to a certain capacitance value. Due to passing through the rough measurement first, a fine measurement can be performed with different M values based on the first measurement value, and thus FIG. 5 is a segmented linear waveform.

Specifically, $C_{x,max}$ is the maximum capacitance value that can be measured by the circuit, in the unit of femtofarad abbreviated as fF, and $V_{max}$ is the maximum voltage value that can be output by the analog front-end circuit, in the unit of voltage abbreviated as V. M is the number of parallel connections, θ is the amount of change in the AFE output voltage after the 1 fF capacitor is connected when A is taken as $(0001)_2$, that is, $$\Theta = \frac{C_x}{C_y} V_{ref}.$$

When the measured capacitance is less than $$\frac{C_{x,max}}{8},$$

the charge transfer caused by the connection of the capacitor to be measured is less, so that the signal input of AFE is weak. In this case, the signal-to-noise ratio of the input signal is too low, which limits the measurement accuracy. Therefore, it is necessary to increase the power of the effective signal to improve the signal-to-noise ratio. The number of parallel connections is set to M, according to the principle of charge conservation, since M times of the charge $M*C_x*V_{ref}$ that charges the capacitor to be measured to Vref enters $C_y$, the power of the effective signal is M times the original value, and the capacitance read by this sampling ADC is M times the actual value.

Because more charge transfer is needed to obtain a higher input signal-to-noise ratio when the same capacitor to be measured is connected, Vref is set as a higher voltage, and a 2V Vref is used in the circuit of the disclosure. When the measured capacitance is greater than $$\frac{C_{x,max}}{2},$$

because me power supply voltage of the output stage is 3.3V, the effective upper swing is less than 1.3V, and the connection of the capacitance greater than $$\frac{C_{x,max}}{2}$$

will be unable to maintain the voltage due to insufficient swing of the output stage. Therefore, it should be considered to reduce the power of the effective signal to ensure the bias of the output stage.

As shown in FIG. 5, when M is set to 4, it is assumed that the minimum capacitance accuracy for measurement is C, and when A is $(0001)_2$, the change of the AFE output voltage corresponding to the capacitance of 1 C is V, while the corresponding digital quantity after V is measured by ADC is 1 least significant bit (LSB). During measurement, a rough measurement is performed first and A is set to $(0001)_2$, in this situation, the capacitance of 1 C corresponds to the ADC output digital quantity of 1 LSB, and which range of the capacitor to be measured is accessed is determined based on the digital quantity obtained from the rough measurement.

If the measured capacitance is greater than $$\frac{C_{x,max}}{2},$$

A is kept unchanged, the measurement is performed again on the capacitor to be measured, and then the average value of the two AD values is calculated as output or the first measurement value is directly used as the capacitance measurement value. If the measured capacitance is less than $$\frac{C_{x,max}}{2},$$

A is set to $(1111)_2$, the measurement is performed again on the capacitor to be measured, in this situation, the capacitance of 1 C corresponds to the ADC output digital quantity of 4 LSBs, and thus it is necessary to shift the ADC output digital quantity by 2 bits to the left. If the measured capacitance is in the range of $$\frac{C_{x,max}}{8}, \sim \frac{C_{x,max}}{2},$$

A is set to $(0011)_2$, the measurement is performed again on the capacitor to be measured, in this situation, the capacitance of 1 C corresponds to the ADC output digital quantity of 2 LSBs, and then the result is shifted to the left by 1 bit.

Assuming that the shifted result is D, this result indicates that the value of the capacitance to be measured is D*C. By flexibly adjusting $C_y$ and various parameters in the analog front-end circuit, or performing digital signal processing on the shifted result, the digital quantity results required for various scenarios can be obtained.

As can be seen from the above, the measurement circuit of the disclosure realizes the function of detecting and outputting a small capacitance in a large range, which has high accuracy characteristics. The disclosure provides a rough-fine measurement approximation type AFE, in which based on the charge transfer type AFE, different sizes of capacitors under a wide range of capacitance to be measured are performed with rough and fine measurements to obtain the best measurement value, which achieves a resolution of 1 fF within the 2-pF measurement range while the maximum error within the 1-pF measurement range does not exceed the accuracy of 3 LSB (1 LSB=0.5 mV).

In addition, the disclosure designs a simple and effective control timing and corresponding logic circuit, and designs a comparator for successive-approximation-register (SAR) ADC with offset voltage calibration technology, which improves the accuracy of the ADC. Moreover, the disclosure proposes a matching intermediate structure (i.e., high-precision follower) between AFE and ADC, AFE and ADC are isolated, a sleeve type folding common-gate operational amplifier is used as a first stage to improve gain, and a second stage is made of a push-pull structure, so that the follower can drive a large capacitor and has the characteristic of high precision without causing errors.

It should be noted that the device embodiments described above are only illustrative, in which the units described as separate components can be or may not be physically separated, and the components displayed as units can be or may not be physical units, that is, they can be located in one place, or they can be distributed across multiple network units. Some or all of the modules can be selected according to actual needs to achieve the purpose of the embodiment. In addition, in the accompanying drawings of the device embodiments provided by the disclosure, the connection relationships between modules indicates that they have communication connections, which can be specifically implemented as one or more communication buses or signal lines. Those skilled in the art can understand and implement it without paying creative labor.

The above is illustrated embodiments of the disclosure. It should be noted that, for those skilled in the related art, several changes and modifications can be made without departing from the principles of the disclosure, and these changes and modifications are also considered to be within the scope of protection of the disclosure.

What is claimed is:

1. A capacitance measurement circuit, comprising: an analog front-end circuit, a parasitic capacitor, an analog to digital converter (ADC), an output shift register, and a controller;
   wherein input terminals of the ADC are connected to an output terminal of the analog front-end circuit, and an output terminal of the ADC is connected to the output shift register;
   wherein an input terminal of the analog front-end circuit is connected to the parasitic capacitor and a capacitor to be measured individually; the analog front-end circuit comprises M numbers of current mirror circuits connected in parallel, where $M=2^{N-1}$ and N is a positive integer;
   wherein the controller is configured to control the analog front-end circuit, the parasitic capacitor, the ADC, and the output shift register to measure the capacitor to be measured, specifically to:
   step 1, control one of the current mirror circuits of the analog front-end circuit to be turned on;
   step 2, disconnect the capacitor to be measured, and control an inverting input terminal of the ADC to continuously collect analog front end (AFE) output voltages of the analog front-end circuit before connection of the capacitor to be measured;
   step 3, control the analog front-end circuit to charge the parasitic capacitor to a first reference voltage, and record an AFE output voltage $V_N$ currently collected at the inverting input terminal of the ADC;
   step 4, connect the capacitor to be measured, after the analog front-end circuit is stabilized, control a non-inverting input terminal of the ADC to collect an AFE output voltage $V_P$ of the analog front-end circuit, and control the ADC to convert a difference value $(V_P-V_N)$ of the AFE output voltage $V_P$ and the AFE output voltage $V_N$ into a first digital signal;
   step 5, determine, based on a value of the first digital signal, a connection number m of the current mirror circuits, and control the m numbers of current mirror circuits of the analog front-end circuit to be turned on; where $m=2^{n-1}$ and n is a positive integer less than or equal to N; and
   step 6, repeat the step 2 to step 4 to obtain a second digital signal, and control, based on the connection number m, the output shift register to shift the second digital signal to obtain a capacitance measurement value of the capacitor to be measured.

2. The capacitance measurement circuit according to claim 1, wherein after the step 5, the first digital signal is taken as the capacitance measurement value of the capacitor to be measured when a value of the connection number m is 1.

3. The capacitance measurement circuit according to claim 1, wherein in the step 5, the determine, based on a value of the first digital signal, a connection number m of the current mirror circuits, specifically comprises:
   the connection number m is 1 when the value of the first digital signal is greater than $D_{max}/2$; where $D_{max}$ is a maximum output value of the ADC;
   the connection number m is 2 when the value of the first digital signal is less than $D_{max}/2$ and greater than $D_{max}/8$;
   the connection number m is $2^{i-1}$ when the value of the first digital signal is less than $D_{max}/2^i$ and greater than $D_{max}/2^{i+1}$; where i is a positive integer greater than or equal to 3.

4. The capacitance measurement circuit according to claim 3, wherein in the step S6, the control, based on the connection number m, the output shift register to shift the second digital signal to obtain a capacitance measurement value of the capacitor to be measured, specifically comprises:
   control, in response to the value of the connection number m being 1, the output shift register to not shift the second digital signal to obtain the capacitance measurement value of the capacitor to be measured;
   control, in response to the value of the connection number m being 2, the output shift register to shift the second digital signal by one bit to right to obtain the capacitance measurement value of the capacitor to be measured;
   control, in response to the value of the connection number m being $2^{i-1}$, the output shift register to shift the second digital signal to the right by i−1 bits to obtain the capacitance measurement value of the capacitor to be measured.

5. The capacitance measurement circuit according to claim 1, wherein the analog front-end circuit comprises an operational amplifier, a first capacitor, a second capacitor, a voltage follower, and the M numbers of current mirror circuits connected in parallel;
   wherein each of the current mirror circuits comprises two current mirror sub-circuits with a width to length ratio of 1:1 and a reverser arranged between the two current mirror sub-circuits;
   wherein a non-inverting input terminal of the operational amplifier is connected to the input terminal of the analog front-end circuit, an inverting input terminal of the operational amplifier is connected to a first end of the first capacitor, and an output terminal of the operational amplifier is connected to the M numbers of current mirror circuits connected in parallel;
   wherein an input terminal of the voltage follower is individually connected to a first end of the second capacitor and the M numbers of current mirror circuits connected in parallel, and an output terminal of the voltage follower is connected to the output terminal of the analog front-end circuit; and
   wherein a second end of the first capacitor and a second end of the second capacitor each are connected to a signal ground.

6. The capacitance measurement circuit according to claim 5, wherein the input terminal of the analog front-end circuit is connected to the capacitor to be measured, specifically:
   the input terminal of the analog front-end circuit is connected to the capacitor to be measured through a control switch S3;
   the controller is further configured to control the control switch S3 to switch on to thereby control the connection of the capacitor to be measured, or control the control switch S3 to switch off to thereby control the disconnection of the capacitor to be measured.

7. The capacitance measurement circuit according to claim 5,
   wherein the input terminals of the ADC are connected to the output terminal of the analog front-end circuit, specifically:
   the inverting input terminal of the ADC is connected to the output terminal of the analog front-end circuit through a control switch S4, and the non-inverting input terminal of the ADC is connected to the output terminal of the analog front-end circuit;

the controller is further configured to control the control switch S4 to switch on to thereby control connection of the inverting input terminal of the ADC, or control the control switch S4 to switch off to thereby control disconnection of the inverting input terminal of the ADC.

* * * * *